United States Patent
Fukui et al.

(10) Patent No.: US 10,403,498 B2
(45) Date of Patent: Sep. 3, 2019

(54) GROUP III-V COMPOUND SEMICONDUCTOR NANOWIRE, FIELD EFFECT TRANSISTOR, AND SWITCHING ELEMENT

(71) Applicants: NATIONAL UNIVERSITY CORPORATION HOKKAIDO UNIVERSITY, Sapporo-shi, Hokkaido (JP); JAPAN SCIENCE AND TECHNOLOGY AGENCY, Kawaguchi-shi, Saitama (JP)

(72) Inventors: Takashi Fukui, Sapporo (JP); Katsuhiro Tomioka, Sapporo (JP)

(73) Assignees: NATIONAL UNIVERSITY CORPORATION HAKKAIDO UNIVERSITY, Sapporo-Shi, Hokkaido (JP); JAPAN SCIENCE AND TECHNOLOGY AGENCY, Kawaguchi-Shi, Saitama (JP)

( * ) Notice: Subject to any disclaimer, the term of this patent is extended or adjusted under 35 U.S.C. 154(b) by 0 days.

(21) Appl. No.: 15/031,575

(22) PCT Filed: Oct. 29, 2014

(86) PCT No.: PCT/JP2014/005463
§ 371 (c)(1),
(2) Date: Apr. 22, 2016

(87) PCT Pub. No.: WO2015/064094
PCT Pub. Date: May 7, 2015

(65) Prior Publication Data
US 2016/0284536 A1    Sep. 29, 2016

(30) Foreign Application Priority Data
Oct. 31, 2013 (JP) ................ 2013-226675

(51) Int. Cl.
*H01L 21/02* (2006.01)
*B82Y 10/00* (2011.01)
(Continued)

(52) U.S. Cl.
CPC .......... *H01L 21/0262* (2013.01); *B82Y 10/00* (2013.01); *B82Y 40/00* (2013.01);
(Continued)

(58) Field of Classification Search
CPC ......... B82Y 10/00; B82Y 30/00; B82Y 40/00; H01L 21/02373; H01L 21/02381;
(Continued)

(56) References Cited

U.S. PATENT DOCUMENTS 5,663,592 A * 9/1997 Miyazawa ............. B82Y 10/00
                                                    257/102
7,099,073 B2 * 8/2006 Chowdhury ........... B82Y 20/00
                                                    359/328

(Continued)

FOREIGN PATENT DOCUMENTS

JP    07-6963 A    1/1995
JP    07-45813 A   2/1995

(Continued)

OTHER PUBLICATIONS

Katsuhiro Tomioka, Junichi Motohisa, Shinjiroh Hara and Takahashi Fukui, "Control of InAs Nanowire Growth Directions on Si", Nano Letters, ACS, vol. 8 No. 10, Sep. 11, 2008, pp. 3475-3480.

(Continued)

*Primary Examiner* — Ori Nadav
(74) *Attorney, Agent, or Firm* — Brundidge & Stanger, P.C.

(57) ABSTRACT

The present invention pertains to a group III-V compound semiconductor nanowire able to be used in a group III-V compound semiconductor MOSFET (FET) operational at a (Continued)

small subthreshold (100 mV/dec or less). A side face of the group III-V compound semiconductor nanowire is a (−110) plane constituted of a very small (111) plane. The group III-V compound semiconductor nanowire has, e.g., a first layer having a (111)A plane as a side face thereof, and a second layer having a (111)B plane as a side face thereof. The first layer and the second layer are stacked alternatingly in the axial direction.

4 Claims, 11 Drawing Sheets

(51) Int. Cl.
*B82Y 40/00* (2011.01)
*H01L 29/66* (2006.01)
*H01L 29/775* (2006.01)
*H01L 29/06* (2006.01)
*H01L 29/41* (2006.01)
*H01L 29/04* (2006.01)
*H01L 29/16* (2006.01)
*H01L 29/20* (2006.01)
*H01L 29/786* (2006.01)
*B82Y 30/00* (2011.01)

(52) U.S. Cl.
CPC .. *H01L 21/02373* (2013.01); *H01L 21/02381* (2013.01); *H01L 21/02433* (2013.01); *H01L 21/02538* (2013.01); *H01L 21/02546* (2013.01); *H01L 21/02603* (2013.01); *H01L 21/02609* (2013.01); *H01L 21/02639* (2013.01); *H01L 21/02658* (2013.01); *H01L 29/045* (2013.01); *H01L 29/068* (2013.01); *H01L 29/0676* (2013.01); *H01L 29/16* (2013.01); *H01L 29/20* (2013.01); *H01L 29/2003* (2013.01); *H01L 29/413* (2013.01); *H01L 29/66469* (2013.01); *H01L 29/66977* (2013.01); *H01L 29/775* (2013.01); *H01L 29/78642* (2013.01); *B82Y 30/00* (2013.01)

(58) Field of Classification Search
CPC ......... H01L 21/02433; H01L 21/02538; H01L 21/02546; H01L 21/02603; H01L 21/02609; H01L 21/0262; H01L 21/02639; H01L 21/02658; H01L 29/045; H01L 29/0676; H01L 29/068; H01L 29/16; H01L 29/20; H01L 29/2003; H01L 29/413; H01L 29/66469; H01L 29/66977; H01L 29/775
USPC .......................................................... 257/27
See application file for complete search history.

(56) References Cited

U.S. PATENT DOCUMENTS

| 8,030,108 | B1 | 10/2011 | Lee et al. |
| 2003/0173559 | A1* | 9/2003 | Akiyama ................ C30B 23/02 257/14 |
| 2007/0238281 | A1* | 10/2007 | Hudait .............. H01L 21/02381 438/604 |
| 2009/0090934 | A1* | 4/2009 | Tezuka ................ H01L 27/1211 257/190 |
| 2010/0097135 | A1 | 4/2010 | Curatola et al. |
| 2011/0163355 | A1 | 7/2011 | Tezuka et al. |
| 2011/0165738 | A1 | 7/2011 | Tezuka et al. |
| 2012/0145990 | A1* | 6/2012 | Samuelson ......... B81C 1/00111 257/13 |
| 2012/0187376 | A1 | 7/2012 | Tomioka et al. |
| 2013/0328014 | A1* | 12/2013 | Shapiro .................. C01G 28/00 257/14 |

FOREIGN PATENT DOCUMENTS

| JP | 09-50058 A | 2/1997 |
| JP | 4966153 B2 | 7/2012 |
| WO | 2010/117330 A1 | 10/2010 |
| WO | 2011/040012 A1 | 4/2011 |

OTHER PUBLICATIONS

H. D. Trinh, et al., "The influences of surface treatment and gas annealing conditions on the inversion behaviors of the atomic-layer-deposition Al2O3/n—In0.53Ga0.47As metal-oxide-semiconductor capacitor", Appl. Phys. Lett., vol. 97, pp. 042903-1-042903-3., Jul. 29, 2010.
É. O'Connor, et al., "A systematic study of (NH4)2S passivation (22%, 10%, 5%, or 1%) on the interface properties of the Al2O3/In0.53Ga0.47As/InP system for n-type and p-type In0.53Ga0.47As epitaxial layers", J. Appl. Phys., vol. 109, pp. 024101-1-024101-10., Jan. 18, 2011.
Y. D. Wu, et al., "Engineering of threshold voltages in molecular beam epitaxy-grown Al2O3/Ga2O3(Gd2O3)/In0.2Ga0.8As", J. Vac. Sci. Technol. B, vol. 28, pp. C3H10-C3H13. Apr. 6, 2010.
Roman Engel-Herbert, et al., "Metal-oxide-semiconductor capacitors with ZrO2 dielectrics grown on In0.53Ga0.47As by chemical beam deposition", Appl. Phys. Lett., vol. 95, pp. 062908-1-062908-3., Aug. 14, 2009.
International Search Report from International Application No. PCT/JP2014/005463 dated Dec. 16, 2014.
Extended European Search Report dated May 24, 2017, for corresponding EP Application No. 14858525.0.
Kimberly A Dick et al., "Control of III-V nanowire crystal structure by growth parameter tuning", Semicond. Sci. Technol. 25 (2010) 024009 (11pp).

* cited by examiner

GROUP III-V COMPOUND SEMICONDUCTOR NANOWIRE, FIELD EFFECT TRANSISTOR, AND SWITCHING ELEMENT

TECHNICAL FIELD

The present invention relates to a group III-V compound semiconductor nanowire, a field effect transistor (hereinafter referred to as "FET") having the group III-V compound semiconductor nanowire, and a switch element having the FET.

BACKGROUND ART

Semiconductor microprocessors and large scale integrated circuits are manufactured by integrating elements such as a metal-oxide-semiconductor field effect transistor (hereinafter referred to as "MOSFET") on a semiconductor substrate. Generally, a complementary MOSFET (hereinafter referred to as "CMOS") is a basic element (switch elements) of such integrated circuits. As the material for the semiconductor substrate, silicon which is group IV semiconductor is mainly used. The integration density and the performance of a semiconductor microprocessor and a large scale integrated circuit can be improved by reducing the size of the transistor making up a CMOS.

A MOSFET which uses a III-V compound semiconductor instead of silicon (hereinafter referred to as "III-V compound semiconductor MOSFET") has also been developed. In such a III-V compound semiconductor MOSFET, defects specific to the chemical bonding state may be formed at the interface between the III-V compound semiconductor and the oxide film, and the interface level may be highly densely introduced. For this reason, performance enhancement of the III-V compound semiconductor MOSFET has been difficult.

In recent years, however, development of the techniques of atomic layer deposition (ALD) of oxide materials has made it possible to fabricate a III-V compound semiconductor MOSFET in which the interface level density is small to a certain degree. As techniques for reducing the interface level density, surface treatment using sulfide aqueous solution, surface etching, introduction of an intermediate layer, use of a different kind of oxides have been proposed for example (see, for example, Non-PTLs 1 to 4).

CITATION LIST

Non-Patent Literature

NPL 1
H. D. Trinh, et al., "The influences of surface treatment and gas annealing conditions on the inversion behaviors of the atomic-layer-deposition Al2O3/n-In0.53Ga0.47As metal-oxide-semiconductor capacitor", Appl. Phys. Lett., Vol. 97, pp. 042903-1-042903-3.
NPL 2
É. O'Connor, et al., "A systematic study of (NH4) 2S passivation (22%, 10%, 5%, or 1%) on the interface properties of the Al2O3/In0.53Ga0.47As/InP system for n-type and p-type In0.53Ga0.47As epitaxial layers", J. Appl. Phys., Vol. 109, pp. 024101-1-024101-10.
NPL 3
Y. D. Wu, et al., "Engineering of threshold voltages in molecular beam epitaxy-grown Al2O3/Ga2O3 (Gd2O3)/In0.2Ga0.8As", J. Vac. Sci. Technol. B, Vol. 28, pp. C3H10-C3H13.
NPL 4
Roman Engel-Herbert, et al., "Metal-oxide-semiconductor capacitors with ZrO2 dielectrics grown on In0.53Ga0.47As by chemical beam deposition", Appl. Phys. Lett., Vol. 95, pp. 062908-1-062908-3.

SUMMARY OF INVENTION

Technical Problem

With the techniques disclosed in Non-PTLs 1 to 4, however, the interface level density cannot be sufficiently reduced, and the subthreshold coefficient of the III-V compound semiconductor MOSFET cannot be set to 100 mV/digit or smaller. In contrast, the subthreshold coefficient of the MOSFET using silicon (hereinafter referred to as "Si-MOSFET") in the recent years is around 70 mV/digit. Accordingly, when a III-V compound semiconductor MOSFET having an interface having a quality equal to that of the Si-MOSFET can be fabricated, the subthreshold coefficient of the III-V compound semiconductor MOSFET is estimated to be around 70 mV/digit.

An object of the present invention is to provide a III-V compound semiconductor MOSFET which can operate with a small subthreshold (100 mV/digit or smaller) and a group III-V compound semiconductor nanowire which can be used in the III-V compound semiconductor MOSFET.

Solution to Problem

The present inventors found that it is possible to form a group III-V compound semiconductor nanowire having a side surface which is flat in atomic level and includes a chemically stable (111) A surface by forming a nanowire in such a manner that the nanowire has a cyclic crystal twinning structure. Further, the present inventors found that a MOSFET in which the interface level density is small and which can operate with a small subthreshold (100 mV/digit or smaller) can be manufactured with use of the group III-V compound semiconductor nanowire. Thus, the present inventors completed the present invention.

Specifically, the present invention relates to a group III-V compound semiconductor nanowire described below.

[1] A group III-V compound semiconductor nanowire which is a nanowire formed of a III-V compound semiconductor in which a side surface of the group III-V compound semiconductor nanowire is a (−110) surface composed of a micro (111) surface.

[2] The group III-V compound semiconductor nanowire according to [1], in which a first layer whose side surface is a (111) A surface and a second layer whose side surface is a (111) B surface are alternately laminated along an axis direction.

[3] The group III-V compound semiconductor nanowire according to [1] or [2], in which a ratio of a (111) A surface in the side surface is greater than 50% and smaller than 100%.

[4] The group III-V compound semiconductor nanowire according to [2], in which each of the first layer and the second layer is formed of 1 to 5 atomic layers, and 90% or more of the first layer and the second layer are formed of 1 to 3 atomic layers.

[5] The group III-V compound semiconductor nanowire according to [1] or [2], in which a roughness of the side surface of the group III-V compound semiconductor nanowire falls within a range of 1 to 6 atomic layers.

[6] The group III-V compound semiconductor nanowire according to any one of [1] to [5], in which the III-V compound semiconductor is InAs, InP, GaAs, GaN, InSb, GaSb, AlSb, AlGaAs, InGaAs, InGaN, AlGaN, GaNAs, InAsSb, GaAsSb, InGaSb, AlInSb, InGaAlN, AlInGaP, InGaAsP, GaInAsN, InGaAlSb, InGaAsSb or AlInGaPSb.

In addition, the present invention relates to a field effect transistor (FET) and a switch element described below.

[7] A field effect transistor including:
a group IV semiconductor substrate having a (111) surface and doped to be a first conductivity type; a group III-V compound semiconductor nanowire disposed on the (111) surface of the group IV semiconductor substrate, the group III-V compound semiconductor nanowire including a first region connected with the (111) surface of the group IV semiconductor substrate and a second region doped to be the first conductivity type or a second conductivity which is different from the first conductivity type; a gate dielectric film disposed at a side surface of the group III-V compound semiconductor nanowire; one of a source electrode and a drain electrode which is connected with the group IV semiconductor substrate; the other of the source electrode and the drain electrode which is connected with the second region of the group III-V compound semiconductor nanowire; and a gate electrode disposed on the gate dielectric film, and configured to apply an electric field to an interface between the (111) surface of the group IV semiconductor substrate and the group III-V compound semiconductor nanowire, in which the group III-V compound semiconductor nanowire is the group III-V compound semiconductor nanowire according to any one of claims 1 to 6.

[8] The field effect transistor according to [7], in which the field effect transistor is a tunnel field effect transistor.

[9] A switch element including the field effect transistor according to [7] or [8].

Advantageous Effects of Invention

According to the present invention, a FET (switch element) which can operate with a small subthreshold (100 mV/digit or smaller) can be readily manufactured. With use of the FET according to the present invention, the power consumption amount of a semiconductor microprocessor and a highly integrated circuit can be suppressed while enhancing the integration density and the performance of the semiconductor microprocessor and the highly integrated circuit.

DESCRIPTION OF EMBODIMENTS

1. Field Effect Transistor

Figure 1A:
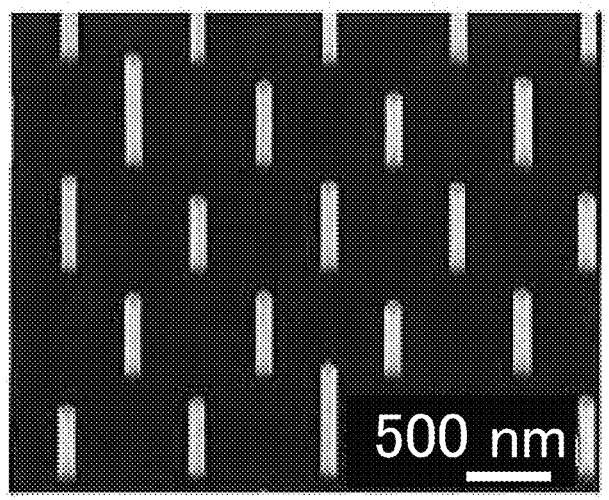
FIG. 1A is a scanning electron microscope image (perspective image) of a silicon substrate on which an InAs nanowire is periodically arranged.

A field effect transistor (FET) according to the present invention includes a group IV semiconductor substrate, a group III-V compound semiconductor nanowire, a gate dielectric film, a source electrode, a drain electrode and a gate electrode. A plurality of FETs may be formed on one group IV semiconductor substrate. While a tunnel field effect transistor (TFET) will be described below as a typical example of a FET according to the present invention, the same basic configuration applies to other FETs.

In a TFET according to the present invention, a (111) surface of the group IV semiconductor substrate and the group III-V compound semiconductor nanowire form an interface (hereinafter referred to as "junction interface"). In the TFET according to the present invention, a tunnel phenomenon occurs at this junction interface. It is to be noted that the "junction interface" refers to a part where the group III-V compound semiconductor nanowire is directly connected with the (111) surface.

The group IV semiconductor substrate is a substrate having a (111) surface and formed of group IV semiconductor, such as a silicon substrate or a germanium substrate. The group IV semiconductor substrate is, for example, a silicon (111) substrate or a silicon (100) substrate. When the group IV semiconductor substrate is a silicon (100) substrate, a (111) surface is formed apart from the (100) surface.

The group IV semiconductor substrate has a portion including the (111) surface. The conductivity type of this portion is n-type or p-type. The conductivity type of this portion is also referred to as "first conductivity type." Therefore, only a part including the (111) surface of the group IV semiconductor substrate may have the first conductivity type, or the entirety of the group IV semiconductor substrate may have the first conductivity type. For example, the group IV semiconductor substrate may also be a group IV semiconductor substrate including an n-type or p-type group IV semiconductor layer whose surface is a (111) surface. In addition, the group IV semiconductor substrate may be doped to be n-type or p-type. As a dopant to be doped to the group IV semiconductor substrate, a dopant that sets the group IV semiconductor substrate to n-type or p-type is used. For example, examples of the dopant that sets the group IV semiconductor substrate to n-type include N, P, As, Sb and Bi. In addition, examples of the dopant that sets the group IV semiconductor substrate to p-type include B, Al, Ga, In and Tl.

In addition, an insulating film may be formed on the surface of the group IV semiconductor substrate. Examples of the insulating film include a silicon oxide film, and a film formed of a compound having a dielectric constant of 3.9 or greater. Examples of the compound having a dielectric constant of 3.9 or greater include silicon nitride and HfAlO.

The group III-V compound semiconductor nanowire is a structure formed of a group III-V compound semiconductor having a diameter of 2 to 100 nm and a length of 50 nm to 10 μm. For example, the group III-V compound semiconductor nanowire is arranged on the (111) surface of the group IV semiconductor substrate such that the longitudinal axis thereof is perpendicular to the (111) surface. In the following description, the surface along the longitudinal axis (hereinafter referred to as "axis") of the nanowire is referred to as "side surface." The group III-V compound semiconductor may be a semiconductor composed of two elements, a semiconductor composed of three elements, a semiconductor composed of four elements, or a semiconductor composed of five or more elements.

Examples of the group III-V compound semiconductor composed of two elements include InAs, InP, GaAs, GaN, InSb, GaSb and AlSb. Examples of the group III-V compound semiconductor composed of three elements include AlGaAs, InGaAs, InGaN, AlGaN, GaNAs, InAsSb, GaAsSb, InGaSb and AlInSb. Examples of the group III-V compound semiconductor composed of four or more elements include InGaAlN, AlInGaP, InGaAsP, GaInAsN, InGaAlSb, InGaAsSb and AlInGaPSb.

Figure 1B:
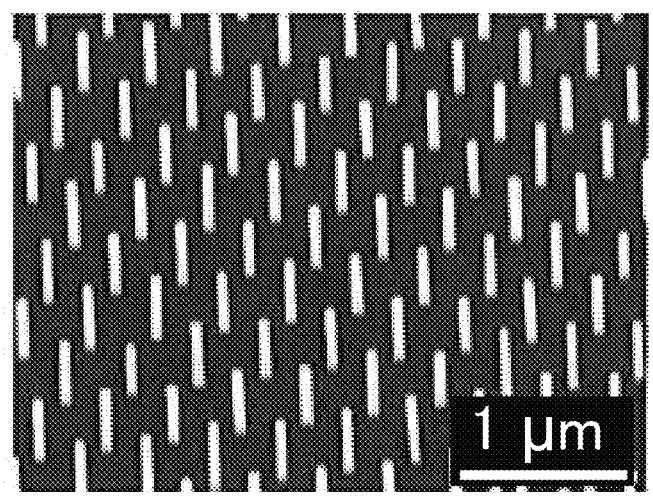
FIG. 1B is a scanning electron microscope image (perspective image) of a silicon substrate on which an InGaAs nanowire is periodically arranged.

FIGS. 1A and 1B are scanning electron microscope images (perspective images) showing exemplary group III-V compound semiconductor nanowires. FIG. 1A is a scanning electron microscope image (perspective image) showing a plurality of InAs nanowires, and FIG. 1B is a scanning electron microscope image (perspective image) showing a plurality of InGaAs nanowires (see Example).

A feature of the group III-V compound semiconductor nanowire according to the present invention included in the TFET according to the present invention is that the side surface thereof is a (−110) surface composed of a micro (111) surface. To be more specific, in the group III-V compound semiconductor nanowire according to the present invention, a first layer whose side surface is a (111) A surface and a second layer whose side surface is a (111) B surface are alternately laminated along the axis direction. Here, the "(111) A surface" refers to a surface where a group III element is arranged at the surface. In addition, the "(111) B surface" refers to a surface where a group V element is arranged at the surface. Each of the first layer and the second layer has a thickness of about 1 to 5 atomic layers (ML), and 90% or more of the first layer and the second layer have a thickness of 1 to 3 atomic layers. With this configuration, the roughness of the side surface of the group III-V compound semiconductor nanowire according to the present invention is about 1 to 6 atomic layers (ML). It is to be noted that the ratio of the (111) A surface in the side surface may be greater than 50%. For example, the ratio of side surface (111) A surface is greater than 50%, and smaller than 100%. Alternatively, the ratio of the (111) A surface in the side surface may be 100%.

Figures 2A, 2B:
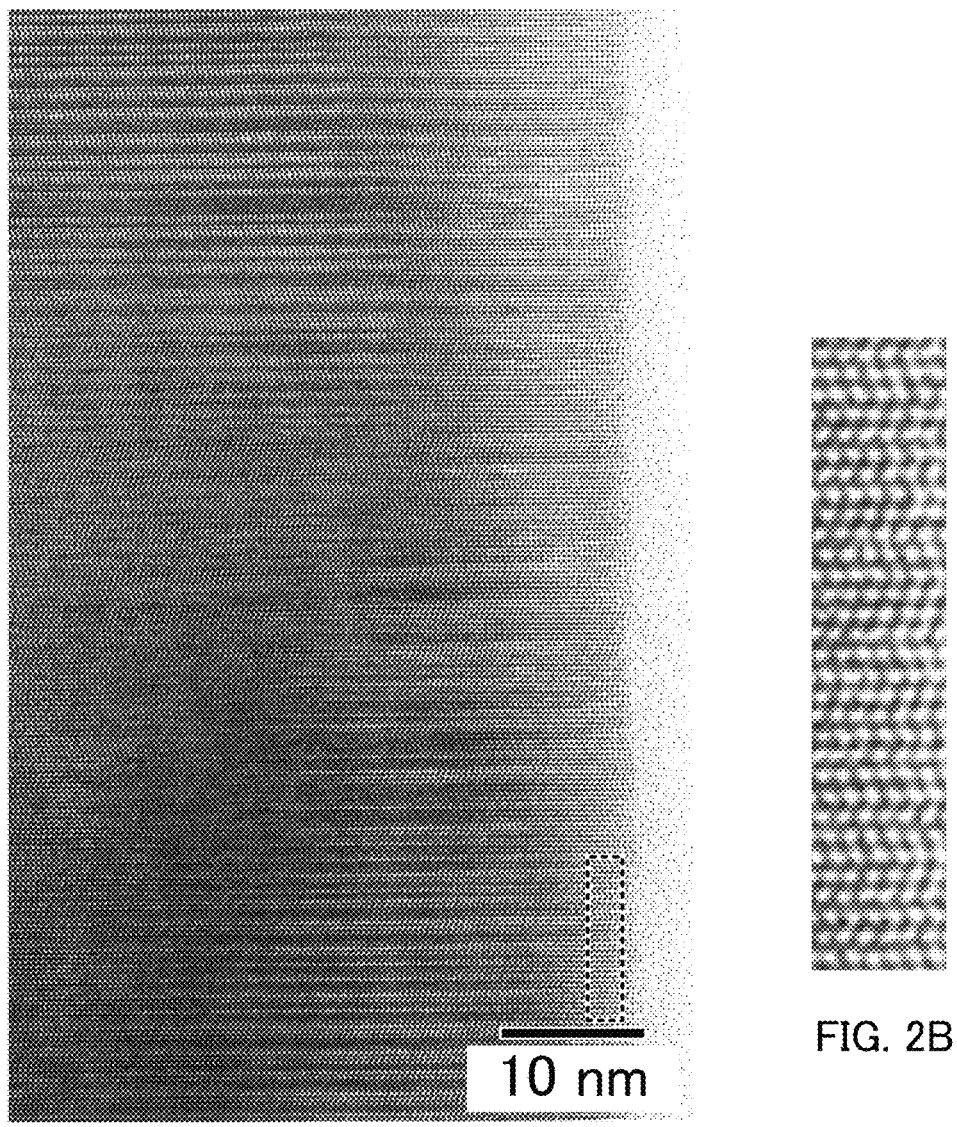
FIG. 2A and FIG. 2B are high resolution transmission electron microscope images of a cross-section of the InGaAs nanowire.
Figure 3:
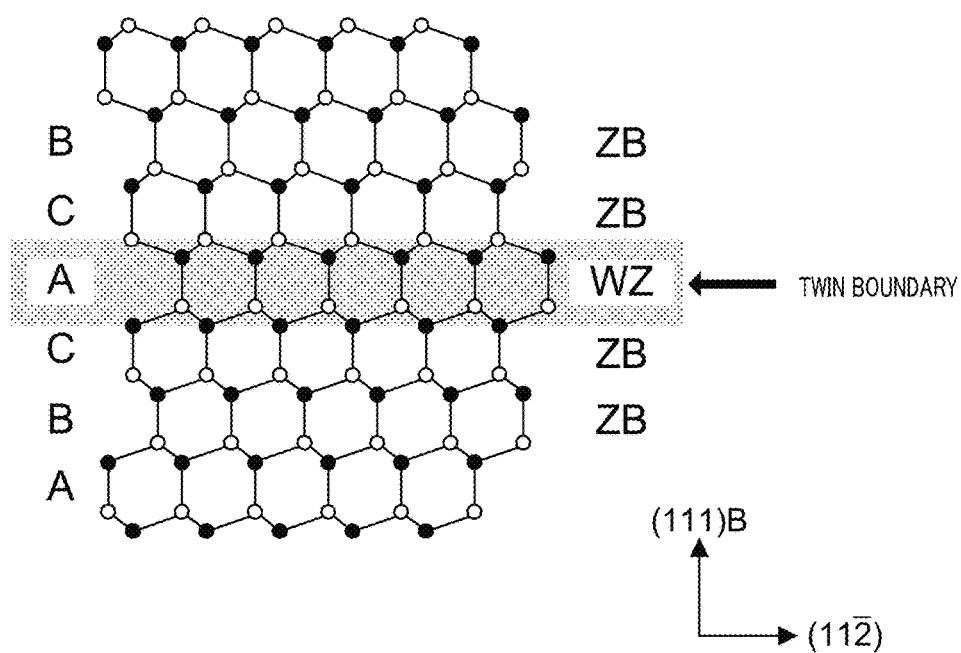
FIG. 3 is a schematic view illustrating a crystal structure of a region around a side surface of the InAs nanowire.

FIGS. 2A and 2B are high resolution transmission electron microscope images showing exemplary cross-sections of the group III-V compound semiconductor nanowire according to the present invention. FIG. 2A is a high resolution transmission electron microscope image showing a cross-section of the InGaAs nanowire, and FIG. 2B is an enlarged image of a region indicated with a broken line in FIG. 2A. FIGS. 3 to 4B are schematic views illustrating a crystal structure in a region around the side surface of the InAs nanowire. In FIGS. 2A to 4B, the vertical direction corresponds to the axis direction of the nanowire, and the horizontal direction corresponds to the radial direction of the nanowire. In FIGS. 3 to 4B, the black circle and the white circle respectively indicate In and As, and the end portion on the right side corresponds to the side surface of the nanowire.

As illustrated in FIG. 3, the group III-V compound semiconductor nanowire according to the present invention has a sphalerite-type (ZB) crystal structure including crystal twinning. At the twin boundary (corresponding to the boundary between the first layer and the second layer), a wurtzite (WZ) crystal structure is observed.

Figure 4A:
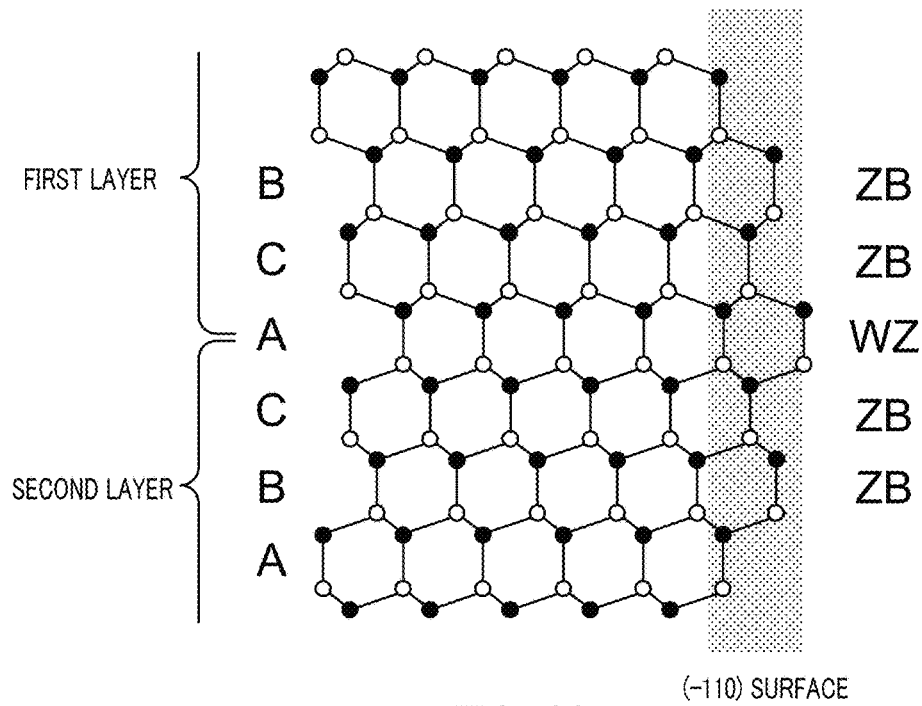
FIG. 4A and FIG. 4B are schematic views illustrating a crystal structure of a region around the side surface of the InAs nanowire.
Figure 4B:
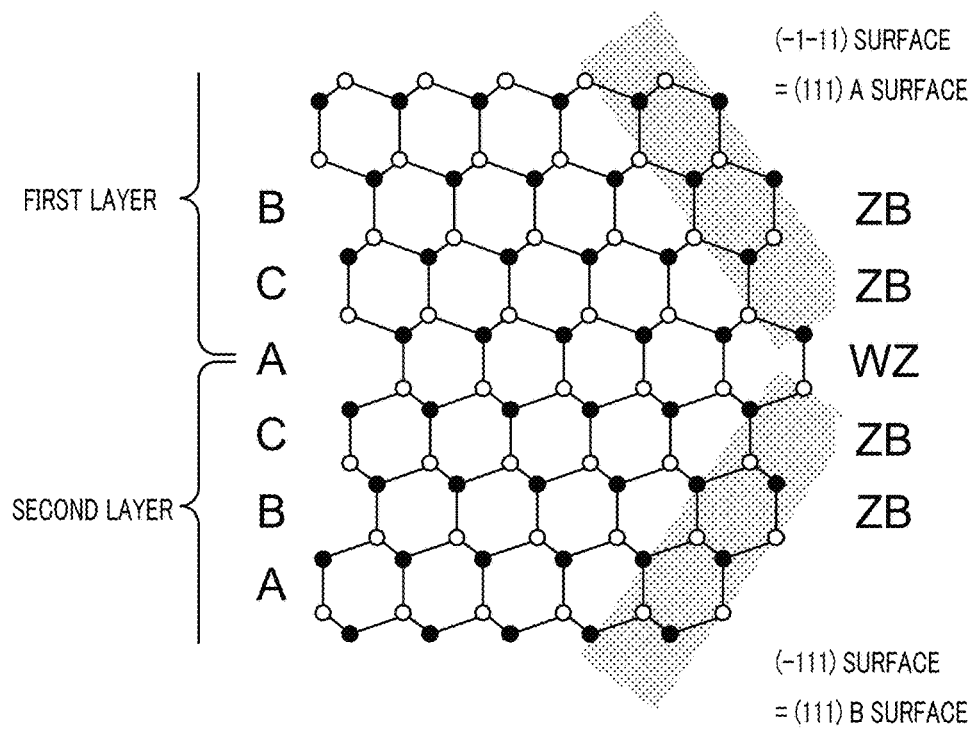

In addition, macroscopically, the side surface of the group III-V compound semiconductor nanowire according to the present invention is a (−110) surface as illustrated in FIG. 4A. However, microscopically, the side surface of the first layer is a (111) A surface, and the side surface of the second layer is a (111) B surface as illustrated in FIG. 4B. Accordingly, in the side surface of the group III-V compound semiconductor nanowire according to the present invention, the micro (111) A surface and the micro (111) B surface exist in an alternate manner.

In the (111) B surface, the trimer of a V group element (for example, As) is formed, and therefore no dangling-bond exists. Meanwhile, while the (111) A surface is chemically stable, a dangling-bond is exposed at the (111) A surface. Accordingly, the (111) A surface directly associates with formation of the interface formed with the gate dielectric film.

When a gate dielectric film is formed on a (−110) surface of a III-V compound semiconductor in a conventional III-V compound semiconductor MOSFET, the interface level density tends to increase in comparison with the case where a gate dielectric film is formed on other surfaces of the III-V compound semiconductor due to formation of As—As dimer or the like. In contrast, in the TFET according to the present invention, a surface which is a (−110) surface in a macroscopic view is composed of the micro (111) A surface and the (111) B surface. With the configuration in which the (111) A surface can contribute to the formation of the interface, reduction of the interface level density is achieved even in the case where a gate dielectric film is formed on a (−110) surface of a III-V compound semiconductor.

Figure 5A:
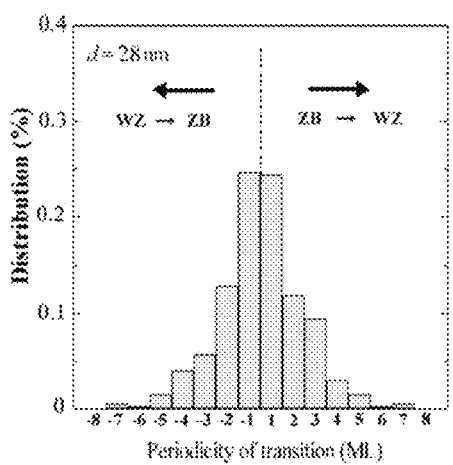
FIG. 5A is a graph showing an introduction frequency of crystal twinning in the InAs nanowire having an outer diameter of 28 nm.
Figure 5B:
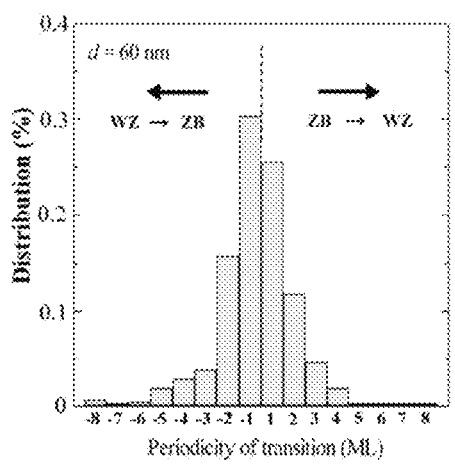
FIG. 5B is a graph showing an introduction frequency of crystal twinning in the InAs nanowire having an outer diameter of 60 nm.
Figure 5C:
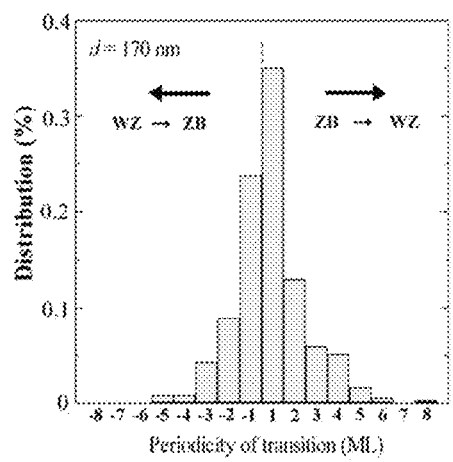
FIG. 5C is a graph showing an introduction frequency of crystal twinning in the InAs nanowire having an outer diameter of 170 nm.

FIGS. 5A to 5C are graphs showing the introduction frequency of crystal twinning (which corresponds to the thickness of the first layer and the second layer) in the InAs nanowire. FIG. 5A is a graph showing the introduction frequency of crystal twinning in the InAs nanowire having an outer diameter of 28 nm. FIG. 5B is a graph showing the introduction frequency of crystal twinning in the InAs nanowire having an outer diameter of 60 nm. FIG. 5C is a graph showing the introduction frequency of crystal twinning in the InAs nanowire having an outer diameter of 170 nm. In the graphs, the boundary from the wurtzite (WZ) crystal structure to the sphalerite-type (ZB) crystal structure and the boundary from the sphalerite-type (ZB) crystal structure to the wurtzite (WZ) crystal structure are separately shown in order not to double count the introduction frequency of crystal twinning.

As illustrated in FIGS. 5A to 5C, in the group III-V compound semiconductor nanowire according to the present invention, the twin boundary is substantially introduced in a unit of 1 to 5 atomic layers (ML) regardless of the outer diameter of the nanowire, and 90% or more of the twin boundary is introduced in a unit of 1 to 3 atomic layers. That is, in the group III-V compound semiconductor nanowire according to the present invention, the first layer and the second layer are composed of 1 to 5 atomic layers (ML), and 90% or more of the first layer and the second layer are composed of 1 to 3 atomic layers. This means the roughness of the side surface of the group III-V compound semiconductor nanowire falls within the range of 1 to 6 atomic layers (ML).

Figure 6A:
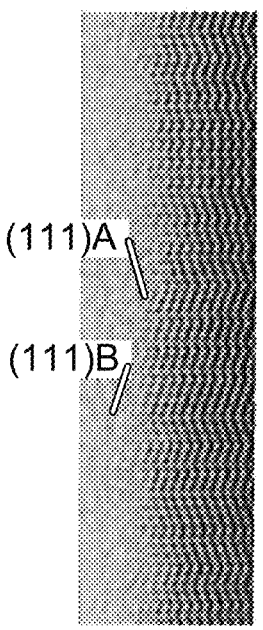
FIG. 6A and FIG. 6B are high resolution transmission electron microscope images showing a crystal structure in a region around the side surface of the InAs nanowire.
Figure 6B:
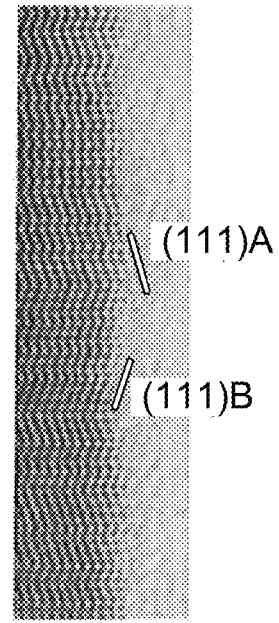
Figure 6C:
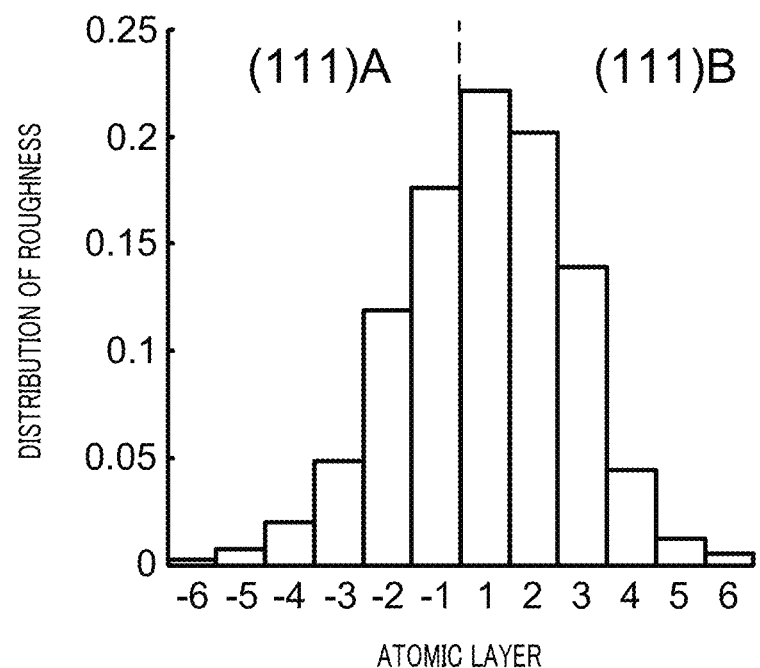
FIG. 6C is a graph showing the roughness of the side surface of the InAs nanowire.

FIGS. 6A and 6B are high resolution transmission electron microscope images showing a crystal structure in a region around the side surface of the InAs nanowire. FIG. 6C is a graph showing the roughness of the side surface of the InAs nanowire. In FIG. 6C, −1 to −6 of the abscissa indicates the number of the atomic layers at a portion (first layer) where the (111) A surface is exposed, and +1 to +6 of the abscissa indicates the number of the atomic layers at a portion (second layer) where the (111) B surface is exposed. The ordinate indicates the ratio thereof. It can be said from FIGS. 6A and 6B that the side surface of the InAs nanowire is composed of a micro (111) A surface and a (111) B surface. In addition, it can be said from FIG. 6C that the roughness of the side surface of the InAs nanowire falls within the range of 1 to 6 atomic layers, and that the side surface of the InAs nanowire is flat in atomic level.

The group III-V compound semiconductor nanowire includes a first region and a second region. The first region is a portion that is joined to the (111) surface of the group IV semiconductor substrate and is uprightly provided on the (111) surface. The second region is a portion that is continuous from the first region. For example, in the longitudinal direction of the group III-V compound semiconductor nanowire, the first region is a portion provided on the substrate side, and the second region is a portion provided on the side opposite to the substrate side.

The conductivity type of the first region is not limited. For example, the conductivity type of the first region may be the first conductivity type as with the group IV semiconductor substrate, or the second conductivity type (described later) as with the second region. In the former case, the density of the first conductivity type (n-type or p-type) dopant in the first region is smaller than the density of the first conductivity type dopant in the group IV semiconductor substrate. In the latter case, the density of the second conductivity type (p-type or n-type) dopant in the first region is smaller than the density of the second conductivity type dopant in the second region. Naturally, the first region may be an intrinsic semiconductor. Examples of the dopant for setting the first region to n-type include C, Si, Ge, Sn, O, S, Se and Po. Examples of the dopant for setting the first region to p-type include Zn, Cd, Hg, Te and C.

The second region is of a conductivity type of one of n-type and p-type which is opposite to the first conductivity type. The conductivity type of the second region is also referred to as "second conductivity type." For example, by doping the second conductivity type dopant, the second region can be set to the second conductivity type. One or more kinds of the second conductivity type dopant may be used. Examples of the dopant for setting the second region to n-type include C, Si, Ge, Sn, O, S, Se and Po. Examples of the dopant for setting the second region to p-type include Zn, Cd, Hg, Te and C.

It is to be noted that, by setting the conductivity type of the second region to the first conductivity type which is identical to that of the group IV semiconductor substrate, it is possible to fabricate a common FET which is not a TFET (see Example). That is, by setting the conductivity type of the second region to the first conductivity type which is identical to that of group IV semiconductor substrate, a common FET can be fabricated, and by setting the conductivity type of the second region to the second conductivity type which is different from that of the group IV semiconductor substrate, a TFET can be fabricated. For example, by doping the first conductivity type dopant, the second region can be set to the first conductivity type. One or more kinds of the first conductivity type dopant may be used.

The group III-V compound semiconductor nanowire according to the present invention can be manufactured by the manufacturing method for a group III-V compound semiconductor nanowire described later.

Now the description is returned to the description of the TFET according to the present invention. The gate dielectric film is an insulating film formed on the side surface of the group III-V compound semiconductor nanowire. As described above, the group III-V compound semiconductor nanowire according to the present invention has a side surface which is flat in atomic level and includes chemically stable (111) A surface. The gate dielectric film forms an interface whose interface level density is small with respect to the (111) A surface. Examples of the gate dielectric film include a silicon oxide film, and a film formed of a compound having a dielectric constant of 3.9 or greater. Examples of the compound having a dielectric constant of 3.9 or greater include silicon nitride and HfAlO.

The source electrode is connected to the source region of the TFET according to the present invention and the drain electrode is connected to the drain region of the TFET according to the present invention. Examples of the source electrode and the drain electrode include a Ti/Au alloy film, a Ti/Al/Ti/Au alloy film, a Ge/Au/Ni/Au alloy film and the like.

The positions of the source electrode and the drain electrode differ depending on the structure of the TFET according to the present invention. For example, in the case where the group IV semiconductor substrate functions as the source region and the second region of the group III-V compound semiconductor nanowire function as the drain region, the source electrode is connected to the group IV semiconductor substrate and the drain electrode is connected to the second region of the group III-V compound semiconductor nanowire. Meanwhile, in the case where the group IV semiconductor substrate functions as the drain region and the second region of the group III-V compound semiconductor nanowire function as the source region, the source electrode is connected to the second region of the group III-V compound semiconductor nanowire and the drain electrode is connected to the group IV semiconductor substrate.

The gate electrode is disposed on the gate dielectric film, and can apply an electric field to a junction interface between the group IV semiconductor substrate and the group III-V compound semiconductor nanowire.

As long as the effect according to the present invention can be obtained, the FET of the present invention may further include components other than the above-described components such as an insulation protective film, for example. The insulation protective film is arranged on the group IV semiconductor substrate such that the thickness direction thereof is aligned with the longitudinal axial direction of the group III-V compound semiconductor nanowire. The insulation protective film may be arranged on the entire group IV semiconductor substrate, or on a part of the group IV semiconductor substrate. From the viewpoint of protecting the group III-V compound semiconductor nanowire, the gate dielectric film and the gate electrode, it is preferable that the insulation protective film have a thickness enough to cover at least a part of the first region and the second region of the group III-V compound semiconductor nanowire. From the view point of sufficiently obtaining electrical insulation property and performing formation with a solution having a low viscosity which does not cause bending of the nanowire, it is preferable that the insulation protective film be a benzocyclobutene (BCB) layer.

In the FET according to the present invention, the junction interface between the group IV semiconductor substrate and the group III-V compound semiconductor nanowire preferably includes neither dislocation nor defect, but may include a small number of dislocations or defects. To be more specific, the period of misfit dislocation at the junction interface needs only to be longer than the period of misfit dislocation calculated from lattice mismatch between the group IV semiconductor and the group III-V compound semiconductor. In addition, the density of threading dislocation at the junction interface needs only to fall within a range of 0 to $10^{10}$ dislocations/cm$^2$. By manufacturing the FET of the present invention using the method of manufacturing a FET according to the present invention, which will be described later, it is possible to manufacture the FET according to the present invention having the junction interface practically including neither dislocation nor defect.

In the TFET according to the present invention, the junction interface between the (111) surface of the group IV semiconductor substrate and the group III-V compound semiconductor nanowire functions as a tunnel layer. As shown in the embodiment, when a positive or negative bias is applied to the gate electrode, carriers in the source region (the group IV semiconductor substrate or the second region of the group III-V compound semiconductor nanowire) move into the channel region (the first region of the group III-V compound semiconductor nanowire) by a tunnel phenomenon (an ON state is set). This operation corresponds to a switch operation of an n-type or p-type MOSFET of a CMOS switch. Since the height of an energy barrier of the junction interface varies depending on the type of the group III-V compound semiconductor making up the group III-V compound semiconductor nanowire, it is possible to arbitrarily control a supply voltage required for an ON state by changing the type of the group III-V compound semiconductor.

Since the interface level density at the interface between the group III-V compound semiconductor nanowire and the gate dielectric film is small, the FET according to the present invention can operate with a small subthreshold (100 mV/digit or smaller) (see Example). The power consumption of the semiconductor device can be reduced by using the FET according to the present invention as a switch element. As a result, power saving and reduction of environmental load can be achieved.

2. Manufacturing Method of FET

While a manufacturing method of a TFET will be described as a typical example of a manufacturing method of the FET according to the present invention, the same basic steps apply to other FETs. A manufacturing method of the TFET according to the present invention includes a nanowire growth step, a gate electrode formation step, a step of forming a source electrode and a drain electrode.

The "nanowire growth step" is a step of growing a group III-V compound semiconductor nanowire on a (111) surface of the first conductivity type of the group IV semiconductor substrate. When only the nanowire growth step is performed, the group III-V compound semiconductor nanowire according to the present invention can be manufactured. The "gate electrode formation step" is a step of forming a gate electrode for generating an electric field for controlling the flow of the carrier between the source electrode and the drain electrode which acts at the interface between the group IV semiconductor substrate and the group III-V compound semiconductor nanowire. In the gate electrode formation step, a gate dielectric film is formed between the group III-V compound semiconductor nanowire and the gate electrode. The "step of forming a source electrode and a drain electrode" is a step of forming one of the source electrode and the drain electrode in such a manner that the one of the source electrode and the drain electrode is connected to the group IV semiconductor substrate, and a step of forming the other of the source electrode and the drain electrode in such a manner that the other of the source electrode and the drain electrode is connected to the group III-V compound semiconductor nanowire.

The steps other than the nanowire growth step may be appropriately performed on the basis of conventional techniques.

In the manufacturing method for the TFET according to the present invention, a preprocessing step of the group IV semiconductor substrate can be performed prior to the "nanowire growth step" as necessary. Examples of the preprocessing step include a step of forming an insulating film having an opening.

Examples of the group IV semiconductor substrate having the (111) surface on which to form the insulating film include an n-type silicon (111) substrate, a p-type silicon (111) substrate, and a silicon (100) substrate whose (111) surface is wholly or partly exposed by anisotropic etching on the surface. The silicon oxide film as an insulating film can be formed by thermal oxidization of a silicon substrate or by a commonly used method for forming a thin film such as a sputtering method, for example. The thickness of the insulating film is not limited, and may be about 20 nm, for example.

The opening of the insulating film can be formed using a fine patterning technique such as electron beam lithography, photolithography, nanoimprint lithography or the like. The shape of the opening can be arbitrarily determined, and examples of the shape of the opening include a triangular shape, a quadrangular shape, a hexagonal shape and a circular shape. The outer diameter (diameter) of the opening may be, for example, about 2 to 100 nm. When the outer diameter of the opening is excessively large, a plurality of dislocations or defects may be formed at the junction interface. In the case where a plurality of openings are periodically arrayed on one group IV semiconductor substrate, the interval of openings is about 10 nm to several micro meters.

In addition, examples of the preprocessing step include a high-temperature heat treatment. The high-temperature heat treatment is a treatment for removing a natural oxide film formed on the (111) surface of the group IV semiconductor substrate. The natural oxide film inhibits the growth of the group III-V compound semiconductor nanowire. The natural oxide film is removed by performing the high-temperature heat treatment on the group IV semiconductor substrate provided with the opening. When the natural oxide film is removed, the surface ((111) surface in the opening) of the group IV semiconductor substrate is exposed. The high-temperature heat treatment can be performed under a condition of approximately 900° C. in an atmosphere of inert gas such as nitrogen gas and argon gas, and hydrogen gas.

In addition, examples of the preprocessing step include a low-temperature heat treatment. The low-temperature heat treatment is a treatment for reducing the temperature of the group IV semiconductor substrate after the high-temperature heat treatment to about 400° C. to set the (111) surface of the group IV semiconductor substrate to a (111) 1×1 surface. While the (111) surface after the high-temperature heat treatment is typically configured in a 1×1 structure, the (111) surface may possibly be converted to the (111) 2×1 surface during cooling down in some cases. However, by reducing the temperature of the group IV semiconductor substrate to about 400° C., the (111) 2×1 surface can be again converted to the (111) 1×1 surface. It is to be noted that the "(111) 2×1 surface" refers to a surface where the minimum unit making up an atomic array is 2-atom distance×1-atom distance. The "(111) 2×1 surface" refers to a surface where the minimum unit making up an atomic array is 1-atom distance×1-atom distance. The low-temperature heat treatment may be performed at approximately 350 to 450° C. (for example, approximately 400° C.). The low-temperature heat treatment is preferably performed under an atmosphere of inert gas such as nitrogen gas, argon gas, and helium gas, and hydrogen gas.

Further, in the manufacturing method of the TFET according to the present invention, a preparation step of growing the nanowire can be performed during the "nanowire growth step" as necessary. Examples of the preparation step include a step of converting the (111) surface to a (111) A surface or to a (111) B surface. As described above, the "(111) A surface" refers to a surface where a group III element is arranged on the surface. In addition, the "(111) B surface" refers to a surface where a group V element is arranged on the surface. The (111) A surface or the (111) B surface of the group III-V compound semiconductor has a structure in which a (111)2×2 surface, that is, the minimum unit, is configured at a period of 2-atom distance×2-atom distance. Thus, when a group III element or a group V element is arranged in a minimum unit smaller than the 2-atom distance×2-atom distance on the surface of the group IV semiconductor substrate, the group III-V compound semiconductor easily grows on the surface.

The step of converting the (111) surface to the (111) A surface or the (111) B surface can be performed by supplying a group III raw material or a group V raw material to the (111) surface of the IV semiconductor substrate. The step of converting the (111) surface to the (111) A surface or the (111) B surface may be performed after the step of converting the surface of the group IV semiconductor substrate to the (111) 1×1 surface or may be performed simultaneously with the step of converting it to the (111) 1×1 surface. For example, the (111) 1×1 surface can be converted to the (111) A surface or the (111) B surface by converting the (111) 2×1 surface of the group IV semiconductor substrate to the (111) 1×1 surface by the low-temperature heat treatment, and by supplying a group III raw material or a group V raw material to the surface of the IV semiconductor substrate.

Preferably, the group III raw material is a gas containing boron, aluminum, gallium, indium or titanium (or may be an organic metal compound). The group III raw material is an organic alkyl metal compound such as trimethyl indium. Preferably, the group V raw material is a gas containing nitrogen, phosphor, arsenic, antimony or bismuth (may also be an organic metal compound). The group V raw material is, for example, hydrogenated arsenic (arsine; $AsH_3$). Preferably, the group III raw material or group V raw material is supplied at 400 to 500° C.

In addition, examples of the preparation step include an alternate raw material supply modulation method. The "alternate raw material supply modulation method" is a method of alternately supplying a source gas containing a group III element and a source gas containing a group V element to the group IV semiconductor substrate, and forming a thin film of a group III-V compound semiconductor on the (111) A surface or the (111) B surface exposed through the opening of the insulating film. Preferably, the alternate raw material supply modulation method is performed at a temperature lower than a temperature required for growing the group III-V compound semiconductor nanowire. For example, the alternate raw material supply modulation method may be performed at approximately 400° C., or may be performed while raising the temperature from 400° C.

To be more specific, when the (111) A surface is formed on the group IV semiconductor substrate, the raw material gas containing the group III element is supplied first and then the raw material gas containing the group V element is supplied. Furthermore, the raw material gas containing the group III element and the raw material gas containing the group V element are alternately and repeatedly supplied. Meanwhile, when the (111) B surface is formed on the group IV semiconductor substrate, the raw material gas containing the group V element is supplied first and then the raw material gas containing the group III element is supplied. Furthermore, the raw material gas containing the group V element and the raw material gas containing the group III element are alternately and repeatedly supplied.

The supply period for the raw material gas containing the group V element and the supply period for the raw material gas containing the group III element may be about several seconds respectively. In addition, it is preferable to provide an interval of several seconds between the supply of the raw material gas containing the group V element and the supply of the raw material gas containing the group III element. The raw material gas containing the group V element and the raw material gas containing the group III element may be alternately supplied until the thin film of the group III-V compound semiconductor has a desired thickness. The thin film of the III-V compound semiconductor is formed by repeatedly supplying the gas several times.

This alternate raw material supply modulation method also has a compensation effect of again forming the (111) A surface or the (111) B surface even when there is a portion that could not be converted at the time of conversion of the (111) 1×1 surface of the group IV semiconductor substrate to the (111) A surface or the (111) B surface. This is because the group IV element and group III element or group V element are bonded together by the alternate raw material supply modulation method.

Thereafter, the substrate temperature is raised to grow the semiconductor nanowire, and then, the thin film of the III-V compound semiconductor which has been formed using the alternate raw material supply modulation method prevents the group III element or the group V element adsorbed to the substrate from dissociating from each other.

In the nanowire growth step (111), the group III-V compound semiconductor nanowire is grown through the opening of the insulating film from the surface of the group IV semiconductor substrate. The group III-V compound semiconductor nanowire is grown using, for example, a metal-organic chemical vapor phase epitaxy method (hereinafter also referred to as "MOVPE method") or a molecular beam epitaxy method (hereinafter also referred to as "MBE method"). Preferably, the group III-V compound semiconductor nanowire is grown by the MOVPE method.

The semiconductor nanowire can be formed according to the MOVPE method using a normal MOVPE apparatus. That is, a raw material gas containing the group III element and a raw material gas containing the group V element may be provided at a predetermined temperature and under a condition of a reduced pressure.

At this time, for the purpose of forming the (−110) surface composed of the micro (111) surface (for example, the (111) A surface and the (111) B surface) as the side surface of the nanowire, it is preferable to grow the nanowire at a temperature at which an elimination reaction of the raw material easily occur at the time of growing the nanowire. To be more specific, it is preferable to set the growth temperature to a temperature which is higher by 10 to 20° C. than an optimum temperature of nanowire growth. For example, at the time when the InAs nanowire is formed, the optimum growth temperature is 540 to 560° C., and therefore the growth temperature is preferably set to 560 to 580° C. Accordingly, at the time when the InAs nanowire is formed, a gas containing hydrogenated arsenic ($AsH_3$) and trimethyl indium may be provided at approximately 560° C. to 580° C.

In addition, for the purpose of forming the (−110) surface composed of the micro (111) surface (for example, the (111) A surface and the (111) B surface) as the side surface of nanowire, it is preferable to adjust the ratio of the III group element and the V group element contained in the source gas such that the supersaturation of the III group element is high. For example, at the time when the InAs nanowire is formed, the ratio of the V group element to the III group element (V/III ratio) is normally about 250, but the supply amount of the III group element is preferably 1.5 times or more in comparison with the normal case.

When the group III-V compound semiconductor nanowire is formed by the above-mentioned method, the area ratio of the (111) A surface and the (111) B surface is substantially equal to each other. Thereafter, by selectively performing etching of the (111) B surface to additionally expose the (111) A surface as necessary, it is possible to increase the ratio of the (111) A surface which directly associates with the formation of the interface formed with the gate dielectric film. Normally, the (111) B surface is more easily etched than the (111) A surface in an III-V compound semiconductor, and therefore the kind of the etching liquid is not limited as long as the etching liquid is aqueous acidic solution or aqueous alkaline solution which can etch the III-V compound semiconductor. For example, it suffices to perform etching with the mixture of aqueous ammonia and hydrogen peroxide solution (volume ratio: approximately 1:100) for about 1 to 2 seconds. In this manner, it is possible to set the ratio of the (111) A surface to a ratio greater than 50% and smaller than 100%. Alternatively, it is possible to set the ratio of the (111) A surface to 100%.

The formed group III-V compound semiconductor nanowire may be further doped to be n-type or p-type. For example, it is possible to dope an n-type dopant or p-type dopant to the group III-V compound semiconductor nanowire by supplying a doping gas or doping organic metal while forming the group III-V compound semiconductor nanowire using an MOVPE method. For example, by simultaneously supplying a gas containing group IV atoms or the organic metal material and the material of the group III-V compound semiconductor nanowire after forming the first region of the group III-V compound semiconductor nanowire using the MOVPE method, it is possible to form the n-type group III-V compound semiconductor nanowire which becomes a second region. Likewise, by simultaneously supplying a gas containing group VI atoms or the organic metal material and the material of the group III-V compound semiconductor nanowire after forming the first region of the group III-V compound semiconductor nanowire, it is possible to form the p-type group III-V compound semiconductor nanowire which becomes a second region. In addition, by implanting ions composed of group IV atoms into the group III-V compound semiconductor nanowire corresponding to the first region using an ion implantation method, an n-type group III-V compound semiconductor nanowire can be formed. Likewise, by implanting ions composed of group VI atoms into the group III-V compound semiconductor nanowire corresponding to the first region, a p-type group III-V compound semiconductor nanowire can be formed.

Through the above-mentioned procedures, it is possible to form the group III-V compound semiconductor nanowire according to the present invention including the first region and the second region on the (111) surface of the group IV semiconductor substrate such that the longitudinal axis thereof is perpendicular to the (111) surface. In the group III-V compound semiconductor nanowire formed in this manner, the junction interface practically has neither dislocation nor defect. In addition, the side surface of group III-V compound semiconductor nanowire is the (−110) surface composed of the micro (111) surface (to be more specific, the (111) A surface and the (111) B surface).

In the gate electrode formation step, the gate dielectric film is formed at the side surface of the group III-V compound semiconductor nanowire, and the gate electrode is formed on the gate dielectric film. The method of forming the gate dielectric film is not limited. For example, a film formed of silicon oxide ($SiO_2$), aluminum oxide ($Al_2O_3$), hafnium oxide ($HfO_2$) or zirconium oxide ($ZrO_2$) may be formed by an atomic layer deposition (ALD) method or the like. Likewise, the method of forming the gate electrode is not limited. For example, the gate electrode may be formed using a photolithography method. To be more specific, a region other than a portion on which an electrode is to be formed is masked with a resist film, metal such as gold, platinum, titanium, chromium, aluminum, palladium, and molybdenum or semiconductor such as polysilicon is deposited, and the resist film is removed (liftoff). In addition, gold may be further deposited and stacked after the deposition of titanium to form an electrode of a two-layer structure.

In the step of forming a source electrode and a drain electrode, the source electrode and the drain electrode are formed. The method of forming the source electrode and drain electrode is not limited. For example, the source electrode and the drain electrode may be formed using a photolithography method or the like as with the gate electrode.

Of the source electrode, the drain electrode and the gate electrode, the source electrode or the drain electrode to be connected to the second region of the group III-V compound semiconductor nanowire is formed after the nanowire growth step. However, the timing of formation of electrodes other than the source electrode or the drain electrode to be connected to the second region is not limited as long as the electrode can be arranged at a desired position in accordance with the configuration of the TFET.

Through the above-mentioned procedures, TFET according to the present invention can be manufactured.

The FET manufacturing method according to the present invention forms the group III-V compound semiconductor nanowire without using any metal catalyst, and thus can form a device with a high definition crystal structure without being affected by metal contamination. In addition, the FET manufacturing method of the present invention can manufacture a FET having a desired characteristic without using any precise doping technique by appropriately selecting the type of the group IV semiconductor and group III-V compound semiconductor. Furthermore, according to the FET manufacturing method of the present invention, when a nanowire formed of a mixed crystal semiconductor such as InGaAs is formed, only changing the In composition causes band discontinuities on the junction interface to show opposite features. Therefore, with use of this feature, it is possible to manufacture FETs having different switch characteristics by only growing the group III-V compound semiconductor nanowire once.

3. Embodiment

In the following, an embodiment of a field effect transistor (FET) according to the present invention will be described with reference to the accompanying drawings. In the present embodiment, as a typical example of the field effect transistor (FET) according to the present invention, a tunnel field effect transistor (TFET) will be described.

Figure 7:
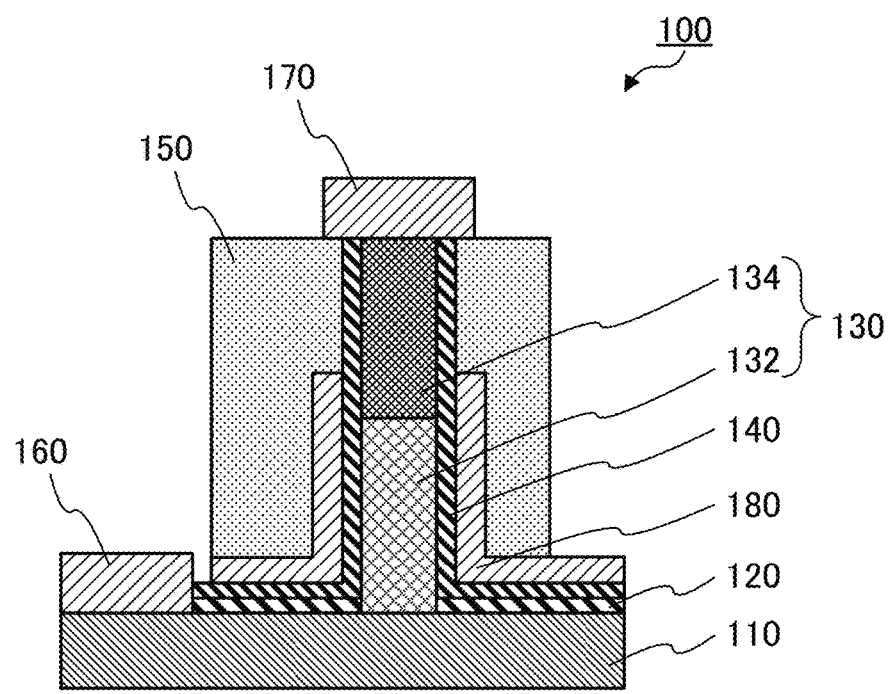
FIG. 7 is a sectional view illustrating a configuration of a TFET according to an embodiment of the present invention.

FIG. 7 is a sectional view illustrating a configuration of a TFET according to the embodiment of the present invention. As illustrated in FIG. 7, TFET 100 according to the present embodiment includes n-doped silicon substrate 110, insulating film 120, group III-V compound semiconductor nanowire 130, gate dielectric film 140, insulating protective film 150, source, drain electrode 170 and gate electrode 180. Group III-V compound semiconductor nanowire 130 is composed of undoped first region 132 and highly p-doped second region 134.

Silicon substrate 110 is a highly n-doped silicon (111) substrate.

Insulating film 120 is an insulating film that covers a surface ((111) surface) of the two surfaces of n-type silicon substrate 110 on which at least group III-V compound semiconductor nanowire 130 is arranged. Insulating film 120 is a silicon oxide (SiO$_2$) film having a film thickness of 20 nm, for example. The (111) surface of n-type silicon substrate 110 is in direct contact with group III-V compound semiconductor nanowire 130 and forms a junction interface. Accordingly, insulating film 120 is not present between n-type silicon substrate 110 and group III-V compound semiconductor nanowire 130.

Group III-V compound semiconductor nanowire 130 is a nanowire formed of a group III-V compound semiconductor having a diameter of 20 nm and a length of 300 nm, for example. Group III-V compound semiconductor nanowire 130 is arranged on the (111) surface of n-type silicon substrate 110 such that the longitudinal axis thereof is substantially perpendicular to the (111) surface. Group III-V compound semiconductor nanowire 130 has a shape of a hexagonal prism.

In group III-V compound semiconductor nanowire 130, the first layer whose side surface is the (111) A surface, and the second layer whose side surface is the (111) B surface alternately laminated along the axis direction. Thus, the micro (111) A surface and the micro (111) B surface are alternately disposed in the side surface of group III-V compound semiconductor nanowire 130. Each of the first layer and the second layer has a thickness of about 1 to 5 atomic layers (ML), and 90% or more of the first layer and the second layer are formed of 1 to 3 atomic layers.

First region 132 (intrinsic semiconductor) of group III-V compound semiconductor nanowire 130 is located on n-type silicon substrate 110 side (n-type semiconductor) relative to second region 134 (p-type semiconductor). First region 132 of group III-V compound semiconductor nanowire 130 and the (111) surface of n-type silicon substrate 110 form a junction interface which practically includes neither dislocation nor defect.

Gate dielectric film 140 is an insulating film that covers a surface of insulating film 120 and a side surface of group III-V compound semiconductor nanowire 130 (a side surface of first region 132 and a part of a side surface of second region 134). Gate dielectric film 140 is a high dielectric film such as a hafnium aluminate (HfAlO$_x$) film.

Insulation protective film 150 is a film formed of insulating resin such as BCB that covers group III-V compound semiconductor nanowire 130, gate dielectric film 140 and gate electrode 180.

Source electrode 160 is arranged on n-type silicon substrate 110 and is connected with n-type silicon substrate 110 (p-type semiconductor). Therefore, insulating film 120 is not present between n-type silicon substrate 110 and source electrode 160. Source electrode 160 is a Ti/Au alloy film formed on n-type silicon substrate 110, for example. Of the two surfaces of n-type silicon substrate 110, source electrode 160 may be arranged on the surface on which group III-V compound semiconductor nanowire 130 is arranged, or may be arranged on the other surface of n-type silicon substrate 110 (surface on which group III-V compound semiconductor nanowire 130 is not arranged).

Drain electrode 170 is arranged on group III-V compound semiconductor nanowire 130 and insulating protective film 150 and is connected with second region 134 (p-type semiconductor) of group III-V compound semiconductor nanowire 130. Drain electrode 170 is, for example, a Ti/Au alloy film, a Ti/Al/Ti/Au alloy film, or a Ge/Au/Ni/Au alloy film arranged on group III-V compound semiconductor nanowire 130 and insulating protective film 150.

Gate electrode 180 is arranged on gate dielectric film 140 in such a manner as to cover the perimeter of first region 132. Gate electrode 180 is, for example, a W film or a Ti/Au alloy film formed on gate dielectric film 140.

FIGS. 8A to 8D are schematic views illustrating an exemplary manufacturing method of TFET 100 according to the present embodiment. In the following, the manufacturing method of TFET 100 will be described with reference to FIGS. 8A to 8D.

Figure 8A:
FIG. 8A to FIG. 8D are schematic views illustrating a manufacturing process for the TFET according to the embodiment of the present invention.
Figure 8B:
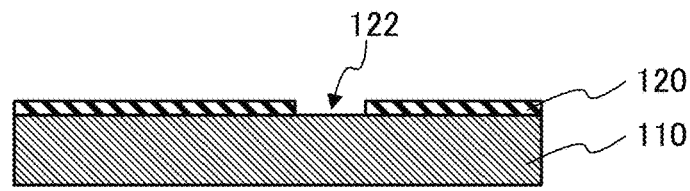
Figure 8C:
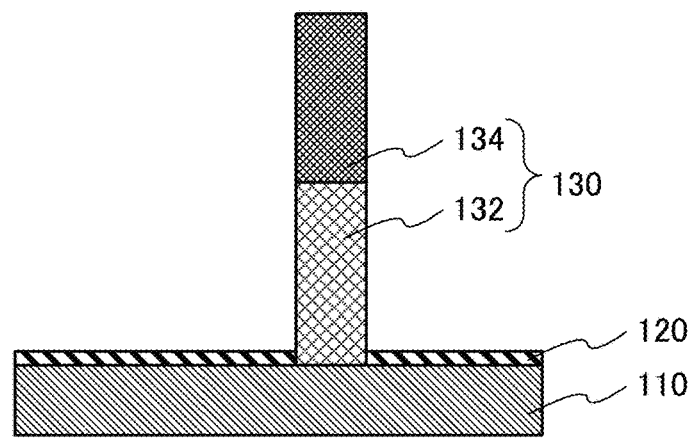

First, as shown in FIG. 8A, n-type silicon substrate 110 is prepared. Insulating film 120 formed of silicon oxide (SiO$_2$) having a film thickness of 20 nm is formed on n-type silicon substrate 110 by a thermal oxidation method. Next, as shown in FIG. 8B, opening 122 having a diameter of 20 nm is formed in insulating film 120 on n-type silicon substrate 110 by a photolithography method or the like. Next, as shown in FIG. 8C, group III-V compound semiconductor nanowire 130 is grown from the (111) surface of n-type silicon substrate 110 exposed through opening 122 by an MOVPE method. At this time, it is preferable to form a thin film of a group III-V compound semiconductor on the (111) surface of n-type silicon substrate 110 by an alternate raw material supply modulation method before growing group III-V compound semiconductor nanowire 130. In addition, it is preferable to increase the growth temperature by 10 to 20°

C. from the optimum growth temperature, and adjust the ratio of the III group element and the V group element such that the supersaturation of the III group element is high. In this manner, it is possible to form group III-V compound semiconductor nanowire 130 whose side surface is the (-110) surface composed of the micro (111) A surface and the micro (111) B surface. It is also possible to increase the ratio of the (111) A surface by selectively etching the (111) B surface immediately after group III-V compound semiconductor nanowire 130 is formed. Thereafter, second region 134 of group III-V compound semiconductor nanowire 130 is subjected to doping, thus forming undoped first region 132 and highly n-doped second region 134.

Figure 8D:
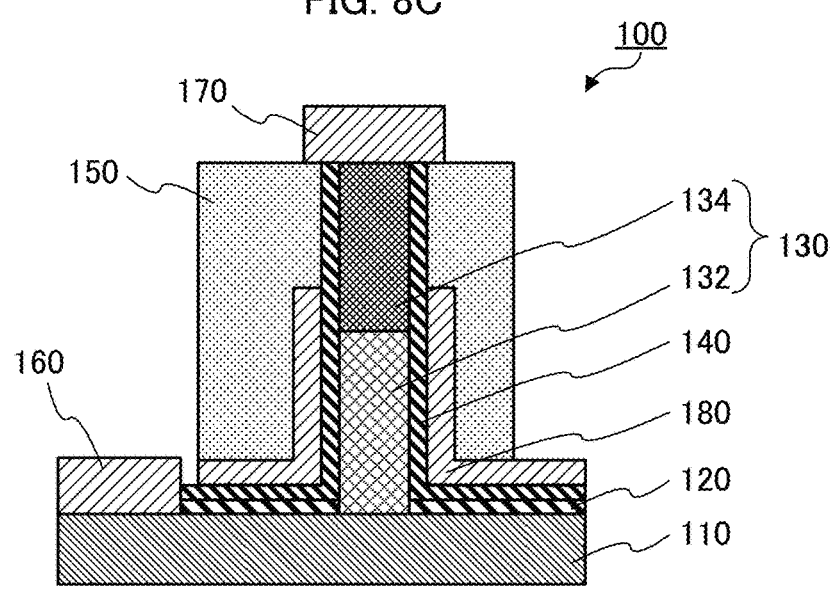

After first region 132 and second region 134 are formed, a surface of insulating film 120 and a surface of group III-V compound semiconductor nanowire 130 are covered with gate dielectric film 140, and then gate dielectric film 140 is covered with gate electrode 180 as illustrated in FIG. 8D. Gate dielectric film 140 is formed by an ALD method, for example. Gate electrode 180 is formed by a sputtering method, for example.

Further, insulation protective film 150 is formed on the surface of n-type silicon substrate 110. Insulation protective film 150 is formed by a spin coating method, for example. Thereafter, each of insulation protective film 150 and gate dielectric film 140 is partially removed to expose a tip (an end portion of second region 134) of group III-V compound semiconductor nanowire 130 and gate dielectric film 140. Such partial removal is performed by a reactive ion etching (reactive ion etching) method, for example.

Finally, the tip of group III-V compound semiconductor nanowire 130 is exposed after insulation protective film 150 is again formed. Thereafter, as illustrated in FIG. 8D, drain electrode 170 is formed on the surface of insulation protective film 150, and source electrode 160 is formed on n-type silicon substrate 110. Drain electrode 170 and source electrode 160 are formed by a vacuum deposition, for example.

In TFET 100 according to the present embodiment, the junction surface of first region 132 of group III-V compound semiconductor nanowire 130 and the (111) surface of n-type silicon substrate 110 functions as a tunnel layer. In TFET 100, carriers in n-type silicon substrate 110 move into group III-V compound semiconductor nanowire 130 (ON state is established) by a tunnel phenomenon when a negative bias is applied to gate electrode 180. This operation corresponds to a switch operation of a p-type MOSFET of a CMOS switch.

In addition, since the height of an energy barrier of the junction interface varies depending on the type of the group III-V compound semiconductor making up group III-V compound semiconductor nanowire 130, the supply voltage required for the ON state can be arbitrarily controlled by changing the type of the group III-V compound semiconductor. In addition, since insulating protective film 150 covers the perimeter of group III-V compound semiconductor nanowire 130, a plurality of TFETs 100 can be integrated.

In addition, since the interface level density at the interface between group III-V compound semiconductor nanowire 130 and gate dielectric film 140 is small, TFET 100 according to the present embodiment can operate with a small subthreshold (100 mV/digit or smaller). Power consumption of the semiconductor device can be reduced by using TFET 100 according to the present embodiment as a switch element. As a result, power saving and reduction of environmental load can be achieved.

It is to be noted that, by setting the conductivity type of second region 134 to n-type which is identical to that of silicon substrate 110, it is possible to fabricate a common FET which is not a TFET.

Example

Hereinafter, the present invention will be described in detail with reference to Examples, but the present invention is not limited to Examples.

1. Preparation of Substrate

An n-type silicon (111) substrate (carrier concentration: $1 \times 10^{18}$ cm$^{-3}$) was subjected to thermal oxidation treatment and a silicon oxide film having a film thickness of 20 nm was formed on the surface. Openings were periodically formed in the silicon oxide film by electron beam lithography and wet chemical etching and the surface of the silicon substrate was exposed therethrough. The shape of the opening was hexagonal, and the outer diameter of the opening part was set to 70 nm.

2. Fabrication of Group III-V Compound Semiconductor Nanowire

As a group III-V compound semiconductor nanowire, an InAs nanowire or an InGaAs nanowire was formed on the (111) surface of silicon substrate.

The substrate in which the openings were formed was set on a sub-atmospheric transverse MOVPE apparatus (HR2339; TAIYO NIPPON SANSO CORPORATION). The internal temperature of the MOVPE apparatus was raised to 900° C., and kept there for five minutes to thereby remove a natural oxide film formed on the opening surface of the silicon substrate. Next, the internal temperature of the apparatus was lowered from 900° C. to 400° C. or 670° C. Hydrogenated arsenic was supplied together with a hydrogen gas (carrier gas). The partial pressure of the hydrogenated arsenic was $2 \times 10^{-4}$ atm.

Next, a thin film of InAs (in the case of fabrication of an InAs nanowire) or a thin film of InGaAs (in the case of fabrication of a InGaAs nanowire) was formed at the opening of the silicon substrate by an alternate raw material supply modulation method. In this step, trimethyl indium, or a combination of trimethyl indium and trimethyl gallium, and arsenic hydride were alternately supplied. To be more specific, a cycle including 2-second supply of trimethyl indium and/or trimethyl gallium, 1-second interval using a hydrogen gas, 2-second supply of hydrogenated arsenic and 1-second interval using a hydrogen gas was repeated 20 times over two minutes. The partial pressure of trimethyl indium was $9 \times 10^{-7}$ atm, the partial pressure of trimethyl gallium was $2 \times 10^{-7}$ atm, and the partial pressure of hydrogenated arsenic was $3 \times 10^{-4}$ atm.

Next, after raising the inner temperature of the apparatus, an InAs nanowire or GaAs nanowire having a length of 1,200 nm was grown. To be more specific, when forming an InAs nanowire, the inner temperature of the apparatus was raised from 400° C. to 580° C., and thereafter trimethyl indium and hydrogenated arsenic were supplied together with hydrogen gas to grow an InAs nanowire having a length of 200 nm (first region; carrier concentration: $1 \times 10^{16}$ cm$^{-3}$). Subsequently, trimethyl indium, arsenic hydride and monosilane gas were supplied together with hydrogen gas to grow an n-type InAs nanowire (second region; carrier density: $1 \times 10^{18}$ cm$^{-3}$) having a length of 1,000 nm. The partial pressure of trimethyl indium was $6 \times 10^{-7}$ atm, the partial pressure of arsenic hydride was $1 \times 10^{-4}$ atm, and the partial pressure of monosilane gas was $1 \times 10^{-7}$ atm.

Meanwhile, when forming an InGaAs nanowire, the inner temperature of the apparatus was raised to 690° C., and thereafter trimethyl indium, trimethyl gallium and arsenic hydride were supplied together with hydrogen gas to grow an InGaAs nanowire (first region; carrier density: $1\times10^{16}$ cm$^{-3}$) having a length of 1,200 nm. Subsequently, trimethyl indium, trimethyl gallium, arsenic hydride and monosilane gas were supplied together with hydrogen gas to grow an n-type InGaAs nanowire (second region; carrier density: $1\times10^{18}$ cm$^{-3}$) having a length of 1,000 nm. The partial pressure of trimethyl indium was $1.3\times10^{-6}$ atm, the partial pressure of trimethyl gallium was $3\times10^{-7}$ atm, the partial pressure of arsenic hydride was 5×10–4 atm, and the partial pressure of monosilane gas was $1\times10^{-7}$ atm.

Through the above-mentioned steps, an InAs nanowire or an InGaAs nanowire was formed on the surface of the silicon substrate. The longitudinal axes of the InAs nanowire and GaAs nanowire were perpendicular to the surface of the silicon substrate. FIG. 1A is a scanning electron microscope image (perspective image) of a silicon substrate on which the InAs nanowires are periodically arranged, FIG. 1B is a scanning electron microscope image (perspective image) of a silicon substrate on which the InGaAs nanowires are periodically arranged.

FIG. 2A is a high resolution transmission electron microscope image showing a cross-section of the InGaAs nanowire, and FIG. 2B is an enlarged image of the region indicated with the broken line in FIG. 2A. In the observation of the cross-sections of the InAs nanowire and the InGaAs nanowire, it was confirmed that the first layer whose side surface is the (111) A surface and the second layer whose side surface is the (111) B surface are alternately laminated along the axis direction, and, in its entirety, the side surface is a (−110) surface composed of the micro (111) surface as illustrated in FIGS. 2A and 2B (see FIGS. 6A and 6B). In addition, each of the first layer and the second layer was substantially formed of 1 to 5 atomic layers, and 90% or more of the first layer and the second layer were formed of 1 to 3 atomic layers (see FIGS. 5A to 5C). In addition, the roughness of the side surface of the nanowire was within the range of 1 to 6 atomic layers (see FIG. 6C).

3. Fabrication of FET

A gate dielectric film was formed on the silicon substrate and the side surface of the group III-V compound semiconductor nanowire, and further a gate electrode was formed thereon. To be more specific, an $Hf_{0.8}Al_{0.2}O$ film (gate dielectric film) having a film thickness of 4 to 14 nm was formed by an ALD method. Thereafter, a W film (gate electrode) having a film thickness of 100 nm was formed by a high frequency sputtering method.

Next, an insulating resin (BCB) film was formed on the silicon substrate on which a dielectric film was formed and the group III-V compound semiconductor nanowire on the silicon substrate was embedded in the insulating resin. Next, a part of the top side of the insulating resin was removed by reactive ion etching and the tip end of the group III-V compound semiconductor nanowire was exposed.

Next, a multilayer film of Ti (20 nm)/Au (100 nm) having a film thickness of 120 nm was formed as a drain electrode on the surface of the insulating resin where the group III-V compound semiconductor nanowire was exposed. In addition, a multilayer film of Ti (20 nm)/Au (30 nm) having a film thickness of 50 nm was formed as a source electrode on the silicon substrate.

Figure 9:
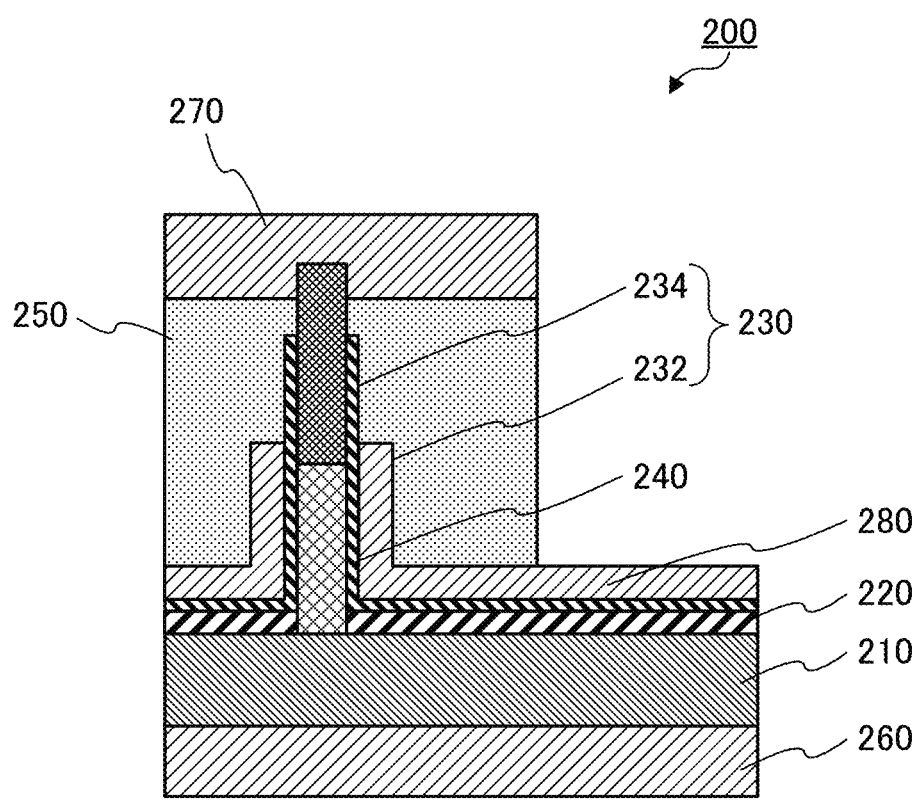
FIG. 9 is a sectional view illustrating a configuration of an FET fabricated in an Example.

FIG. 9 is a sectional view illustrating a configuration of the fabricated FET according to the present invention. As illustrated in FIG. 9, FET 200 includes n-type silicon substrate 210, insulating film (silicon oxide film) 220, group III-V compound semiconductor nanowire 230 (InAs nanowire or InGaAs nanowire), gate dielectric film ($Hf_{0.8}Al_{0.2}O$ film) 240, insulation protective film (film formed of BCB resin) 250, source electrode (Ti/Aumulti layer film) 260, drain electrode (Ti/Au multilayer film) 270 and gate electrode (W film) 280. Group III-V compound semiconductor nanowire 230 is sectioned into first region 232 on n-type silicon substrate 210 side and second region 234 on drain electrode 270 side.

4. Measurement of Electrical Characteristics

The electrical characteristics of the FET fabricated through the above-mentioned steps were measured.

Figure 10A:
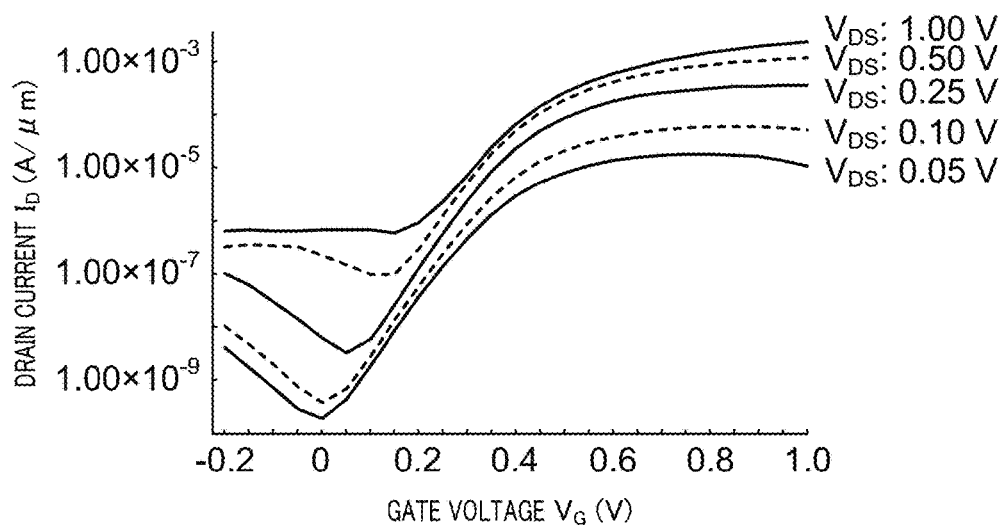
FIG. 10A and FIG. 10B are graphs showing electrical characteristics of the FET fabricated in the Example.
Figure 10B:
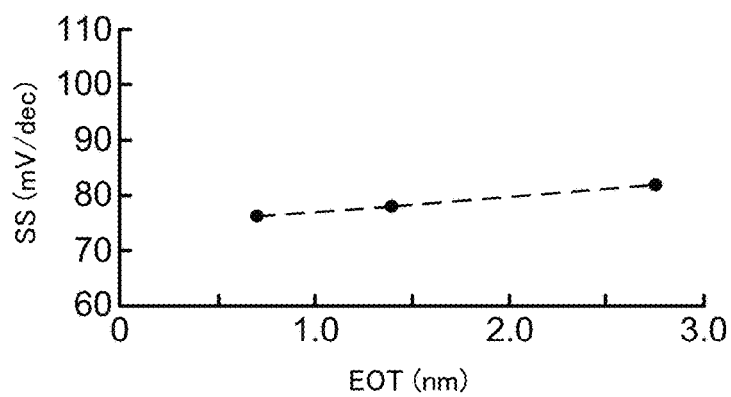

FIG. 10A is a graph showing a relationship between the gate voltage ($V_G$) and the source-drain current ($I_D$) in an FET (the film thickness ($t_{ox}$) of the gate dielectric film: 4 nm, the oxide-film converted film thickness (EOT) of the gate dielectric film: 0.70 nm) having the InAs nanowire. Five curves corresponding to source-drain voltages ($V_{DS}$) are shown in FIG. 10A. FIG. 10B is a graph showing a relationship between the oxide-film converted film thickness (EOT) and the subthreshold coefficient of the gate dielectric film in the FET having the InAs nanowire.

As can be seen in the graphs, the subthreshold coefficient of the FET having the InAs nanowire was 75 to 80 mV/digit. It is to be noted that the interface level density at the interface between the InAs nanowire and the gate dielectric film was $5\times10^{11}$ to $5\times10^{12}$ cm$^{-2}$ eV$^{-1}$.

Figure 11A:
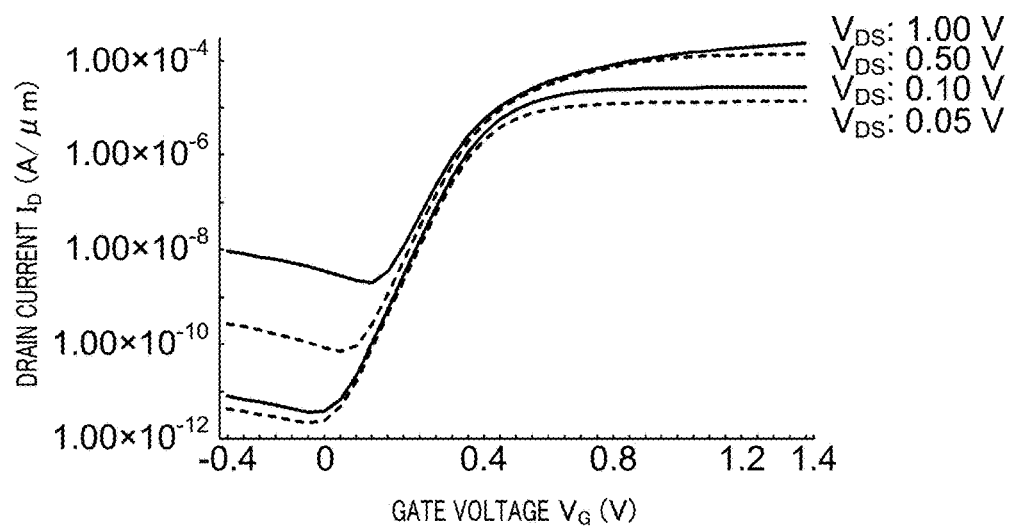
FIG. 11A and FIG. 11B are graphs showing electrical characteristics of the FET fabricated in the Example.
Figure 11B:
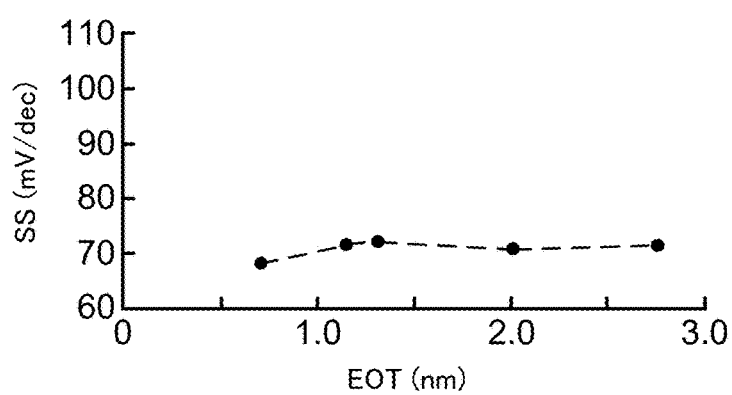

FIG. 11A is a graph showing a relationship between the gate voltage ($V_G$) and the source-drain current ($I_D$) in an FET having the InGaAs nanowire (the film thickness ($t_{ox}$) of the gate dielectric film: 4 nm, the oxide-film converted film thickness (EOT) of the gate dielectric film: 0.70 nm). Four curves corresponding to the source-drain voltages ($V_{DS}$) are shown in FIG. 11A. FIG. 11B is a graph showing a relationship between the oxide-film converted film thickness (EOT) of the gate dielectric film and the subthreshold coefficient in the FET having the InGaAs nanowire.

As can be seen in the graphs, the subthreshold coefficient of the FET having the InGaAs nanowire was 68 to 72 mV/digit. It is to be noted that the interface level density at the interface between the InGaAs nanowire and the gate dielectric film was $5\times10^{11}$ to $5\times10^{12}$ cm$^{-2}$ eV$^{-1}$.

From the above-mentioned results, it can be said that the interface level density of the FET according to the present invention is small, and the FET according to the present invention can be operated with a small subthreshold of 100 mV/digit or smaller.

This application is entitled to and claims the benefit of Japanese Patent Application No. 2013-226675 filed on Oct. 31, 2013, the disclosure each of which including the specification, drawings and abstract is incorporated herein by reference in its entirety.

INDUSTRIAL APPLICABILITY

The FET according to the present invention is suitable for a switch element which is formed on a semiconductor microprocessor and a large scale integrated circuit, for example.

REFERENCE SIGNS LIST

100 TFET
110, 210 N-type silicon substrate
120, 220 Insulating film
122 Opening 130, 230 Group III-V compound semiconductor nanowire
132, 232 First region
134, 234 Second region
140, 240 Gate dielectric film
150, 250 Insulation protective film
160, 260 Source electrode
170, 270 Drain electrode
180, 280 Gate electrode
200 FET

The invention claimed is:

1. A group III-V compound semiconductor nanowire formed of a III-V compound semiconductor, the group III-V compound semiconductor nanowire comprising:
    a first layer that includes a (111) A side surface; and
    a second layer that includes a (111) B side surface;
    wherein the first layer and the second layer are alternately laminated along a first axis direction of the group III-V compound semiconductor nanowire,
    wherein a vertical side surface of the group III-V compound semiconductor nanowire includes alternating the (111) A side surface and the (111) B side surface, and
    wherein a roughness of the side surface of the group III-V compound semiconductor nanowire falls within a range of 1 to 6 atomic layers.

2. The group III-V compound semiconductor nanowire according to claim 1, wherein a ratio of a (111) A surface in the side surface is greater than 50% and smaller than 100%.

3. The group III-V compound semiconductor nanowire according to claim 1, wherein each of the first layer and the second layer is formed of 1 to 5 atomic layers, and 90% or more of the first layer and the second layer are formed of 1 to 3 atomic layers.

4. The group III-V compound semiconductor nanowire according to claim 1, wherein the III-V compound semiconductor is InAs, InP, GaAs, GaN, InSb, GaSb, AlSb, AlGaAs, InGaAs, InGaN, AlGaN, GaNAs, InAsSb, GaAsSb, InGaSb, AlInSb, InGaAlN, AlInGaP, InGaAsP, GaInAsN, InGaAlSb, InGaAsSb or AlInGaPSb.

* * * * *